(12) United States Patent
Jung (10) Patent No.: US 8,982,657 B2
(45) Date of Patent: Mar. 17, 2015

(54) SEMICONDUCTOR DEVICE HAVING LINE SELF-BOOSTING SCHEME

(75) Inventor: Jeongsu Jung, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 295 days.

(21) Appl. No.: 13/529,491

(22) Filed: Jun. 21, 2012

(65) Prior Publication Data
US 2013/0343143 A1    Dec. 26, 2013

(51) Int. Cl.
*G11C 5/14*    (2006.01)
*G11C 8/08*    (2006.01)
*G11C 7/12*    (2006.01)

(52) U.S. Cl.
CPC ... *G11C 8/08* (2013.01); *G11C 7/12* (2013.01)
USPC ............... 365/226; 365/189.04; 365/189.11; 365/230.06; 327/107; 327/112; 327/407

(58) Field of Classification Search
USPC ............... 365/189.04, 189.11, 230.06, 226; 327/107, 112, 407
See application file for complete search history.

(56) References Cited

U.S. PATENT DOCUMENTS 4,967,399 A * 10/1990 Kuwabara et al. ........ 365/230.06
5,633,832 A *  5/1997 Patel et al. ............... 365/230.06

* cited by examiner

*Primary Examiner* — Thao H Bui
(74) *Attorney, Agent, or Firm* — IP & T Group LLP (57) ABSTRACT

A semiconductor device includes: a plurality of target lines to be driven; a plurality of target line drivers configured to drive the corresponding target lines in a logic level corresponding to a plurality of target line selection signals; a plurality of booster enable units configured to generate a booster enable signal by sensing whether a group of target lines that is obtained by grouping the target lines by a predetermined number is enabled or not; and a plurality of self-boosters configured to boost corresponding target lines by sensing levels of the corresponding target lines in response to the booster enable signal.

20 Claims, 6 Drawing Sheets

FIG. 6

SEMICONDUCTOR DEVICE HAVING LINE SELF-BOOSTING SCHEME

BACKGROUND

1. Field

Exemplary embodiments of the present invention relate to a semiconductor designing technology, and more particularly, to a line driving method of a semiconductor device.

2. Description of the Related Art

Most semiconductor memory devices including Dynamic Random Access Memory (DRAM) devices are using a row/column addressing scheme to access a particular memory cell. First, a semiconductor memory device receives a row address from the outside to select a row, which is a word line, and then receives a column address inputted from the outside to select one column in the selected row, which is a bit line.

In order to select one row, word lines have to be driven, and a column selection line has to be driven as well to select one column. The column selection line is a line for transferring a column selection signal that is selectively enabled by decoding the column address in a column decoder. The column selection signal is a control signal of a switch that selectively connects a local data bus and a bit line during a read operation or a write operation. While the column selection signal pulses, data are exchanged between a corresponding bit line and a corresponding local data bus.

As semiconductor memory devices are integrated higher and higher, more load is applied to the column selection line. Since the column selection line is a relatively long line among the lines disposed in a core region of a semiconductor memory device, the load of the line to be driven is not small.

In order to drive a line with much load, a driving circuit is required to have a sufficient driving force. When the driving circuit has a small driving force, a signal transfer rate through the line is dramatically decreased, which is problematic.

A transistor that constitutes the driving circuit has to be designed large to have the sufficient driving force. However, the size of the transistor cannot be enlarged without any definite plan, because the circuit area and current consumption have to be taken into consideration. Therefore, the insufficient driving force of the driving circuit has to be complemented while designing the transistor of the driving circuit in an appropriate size. Two methods have been suggested to complement the driving force of the driving circuit for a line with much load.

One is to insert a repeater in the middle of the line, and the other is to boost the line by generating a control signal. The insertion of a repeater into the middle of the line may cause another problem. Particularly, it takes a dummy cell array and a sense amplifier array to insert a repeater into the column selection line in a DRAM device having an open bit line structure. Since the dummy cell array and the dummy sense amplifier array occupy a great area, it is disadvantageous in terms of the chip size. Also, the method of boosting the line by generating a control signal not only has difficulty in controlling timing but also has increased current consumption.

These are not the only problems of the driving circuit of the column selection line, but also the problems of multiple lines having much load, such as word lines.

SUMMARY

An embodiment of the present invention is directed to a semiconductor memory device that may complement the driving force of a driving circuit for driving a line with much load while suppressing the increase in circuit area and current consumption.

In accordance with an embodiment of the present invention, a semiconductor device includes: a plurality of target lines to be driven; a plurality of target line drivers configured to drive the corresponding target lines in a logic level corresponding to a plurality of target line selection signals; a plurality of booster enable units configured to generate a booster enable signal by sensing whether a group of target lines that is obtained by grouping the target lines by a predetermined number is enabled or not; and a plurality of self-boosters configured to boost corresponding target lines by sensing levels of the corresponding target lines in response to the booster enable signal.

In accordance with another embodiment of the present invention, a semiconductor device includes: a plurality of column selection lines; a plurality of column selection line drivers configured to drive the corresponding column selection lines in a logic level corresponding to a plurality of column selection signals; a plurality of booster enable units configured to generate a booster enable signal by sensing whether a group of column selection lines that is obtained by grouping the column selection lines by a predetermined number is enabled or not; and a plurality of self-boosters configured to boost corresponding column selection lines by sensing levels of the corresponding column selection lines in response to the booster enable signal.

In accordance with yet another embodiment of the present invention, a semiconductor device includes: a plurality of word lines; a plurality of word line drivers configured to drive the corresponding word lines in a logic level corresponding to a plurality of word selection signals; a plurality of booster enable units configured to generate a booster enable signal by sensing whether a group of word lines that is obtained by grouping the word lines by a predetermined number is enabled or not; and a plurality of self-boosters configured to pull-up boost corresponding word lines by sensing levels of the corresponding word lines in response to the booster enable signal.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
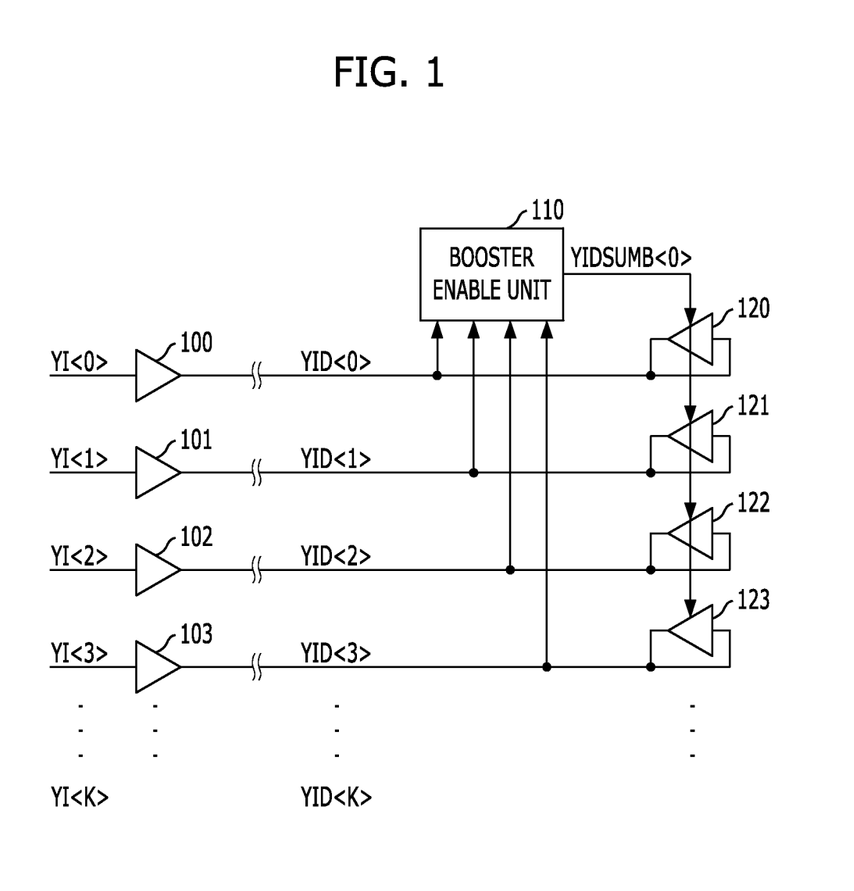
FIG. 1 is a circuit diagram illustrating a column selection line driving circuit of a semiconductor device in accordance with an embodiment of the present invention.

FIG. 1 is a circuit diagram illustrating a column selection line driving circuit of a semiconductor device in accordance with an embodiment of the present invention.

Referring to FIG. 1, the semiconductor device in accordance with the embodiment of the present invention includes a plurality of column selection lines YID<0:K>, a plurality of column selection line drivers 100, 102, 103, . . . , a plurality of booster enable units 110, . . . , and a plurality of self-booster units 120, 121, 122, 123, . . . . The column selection line drivers 100, 102, 103, . . . drive the column selection lines YID<0:K> at a logic level corresponding to a plurality of column selection signals YI<0:K>. The booster enable units 110, . . . generate booster enable signals YIDSUMB<0>, . . . by sensing whether column selection line groups YID<0:3>, . . . that are obtained by grouping the column selection lines YID<0:K> by a predetermined number of lines are enabled or not. The self-booster units 120, 121, 122, 123, . . . senses the logic level of a corresponding column selection line YID<0:K> in response to a corresponding booster enable signal YIDSUMB<0>, . . . and boost the corresponding column selection line YID<0:K>.

Figure 2A:
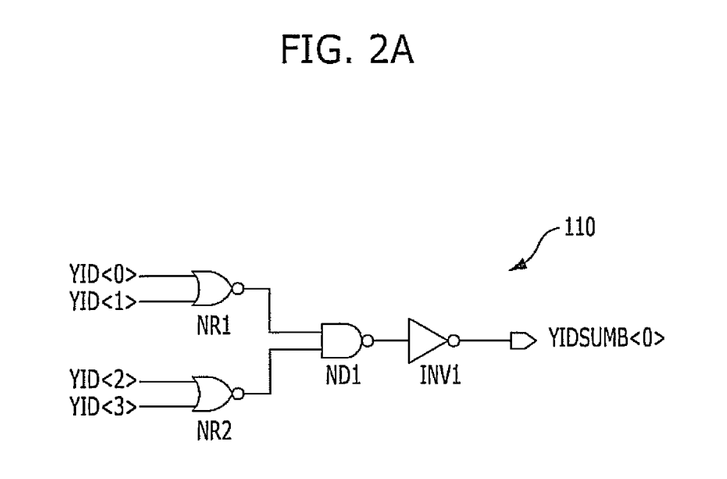
FIGS. 2A and 2B are schematic diagrams illustrating a booster enable unit 110 of FIG. 1.

FIG. 2A is schematic diagram illustrating the booster enable unit 110 of FIG. 1.

Referring to FIG. 2A, the booster enable unit 110 includes a NOR gate NR1, a NOR gate NR2, a NAND gate ND1, and an inverter INV1. The NOR gate NR1 has its input terminal coupled with the column selection lines YID<0> and YID<1>. The NOR gate NR2 has its input terminal coupled with the column selection lines YID<2> and YID<3>. The NAND gate ND1 receives the output signals of the NOR gate NR1 and the NOR gate NR2. The inverter INV1 receives the output signal of the NAND gate ND1 and outputs the booster enable signal YIDSUMB<0>.

The booster enable unit 110 is a NOR or OR logic for performing a NOR or OR operation on the column selection lines YID<0:3> of a corresponding group. The NOR or OR logic may be obtained through diverse methods.

Figure 2B:
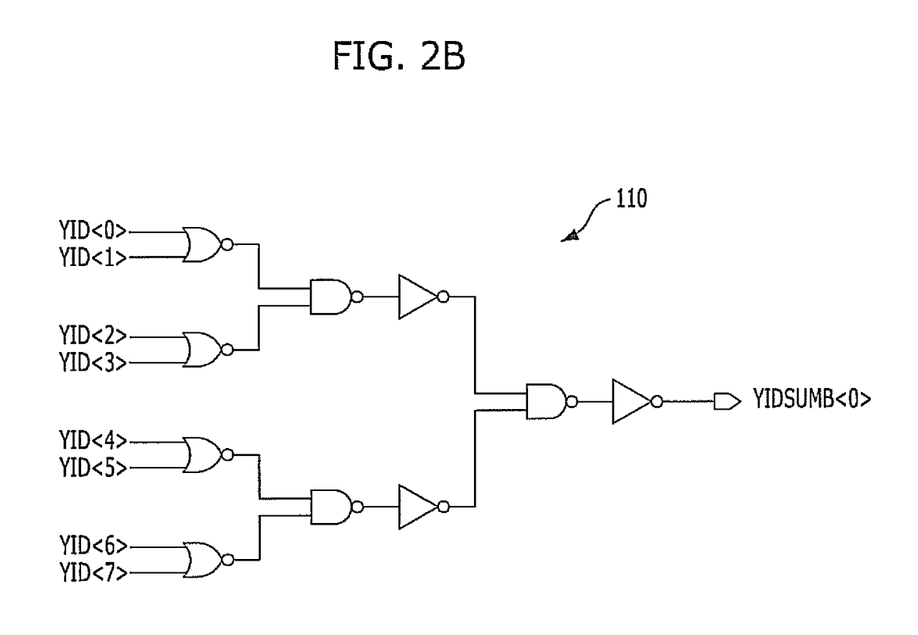

Meanwhile, although FIG. 1 takes an example of a case where the booster enable unit 110 is assigned to every four column selection lines YID<0:3>, 2, 4, or 8 column selection lines may be designed to be assigned by considering the efficiency in terms of circuit area and current consumption. FIG. 2B is a schematic diagram illustrating a booster enable unit assigned to every eight column selection lines.

Figure 3:
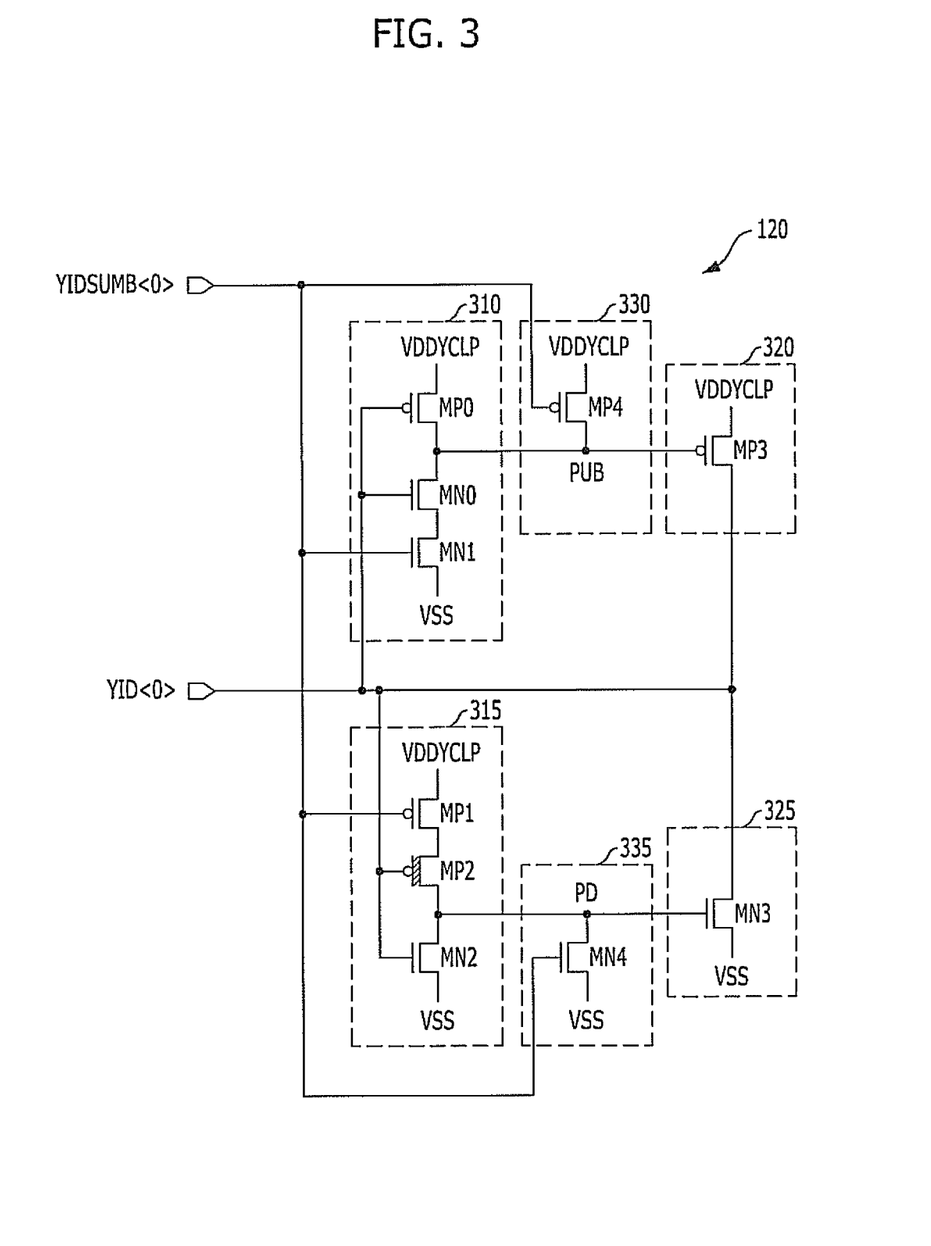
FIG. 3 is a circuit diagram illustrating a self-booster 120 of FIG. 1.

FIG. 3 is a circuit diagram illustrating the self-booster unit 120 of FIG. 1.

Referring to FIG. 3, the self-booster unit 120 includes a pull-up sensor 310, a pull-down sensor 315, a first disabler 330, a second disabler 335, a pull-up driver 320, and a pull-down driver 325. The pull-up sensor 310 enables a pull-up control signal PUB by sensing a pull-up state of the corresponding column selection line YID<0> in response to the corresponding booster enable signal YIDSUMB<0>. The pull-down sensor 315 enables a pull-down control signal PD by sensing a pull-down state of the corresponding column selection line YID<0> in response to the corresponding booster enable signal YIDSUMB<0>. The first disabler 330 disables the pull-up control signal PUB in response to the corresponding booster enable signal YIDSUMB<0>. The second disabler 335 disables the pull-down control signal PD in response to the corresponding booster enable signal YIDSUMB<0>. The pull-up driver 320 pull-up boosts the corresponding column selection line YID<0> in response to the pull-up control signal PUB. The pull-down driver 325 pull-down boosts the corresponding column selection line YID<0> in response to the pull-down control signal PD.

The pull-up sensor 310 includes a PMOS transistor MP0, an NMOS transistor MN1, and an NMOS transistor MN0. The PMOS transistor MP0 includes a source coupled with a clamp voltage terminal VDDYCLP, a drain coupled with an output terminal PUB, and a gate coupled with the corresponding column selection line YID<0>. The NMOS transistor MN1 includes a source coupled with a ground voltage terminal, and a gate for receiving the corresponding booster enable signal YIDSUMB<0>. The NMOS transistor MN0 includes a source coupled with the drain of the NMOS transistor MN1, a drain coupled with the output terminal PUB, and a gate coupled with the corresponding column selection line YID<0>.

Also, the pull-down sensor 315 includes an NMOS transistor MN2, a PMOS transistor MP1, and a PMOS transistor MP2. The NMOS transistor MN2 includes a source coupled with the ground voltage terminal, a drain coupled with an output terminal PD, and a gate coupled with the corresponding column selection line YID<0>. The PMOS transistor MP1 includes a source coupled with the clamp voltage terminal VDDYCLP, and a gate for receiving the corresponding booster enable signal YIDSUMB<0>. The PMOS transistor MP2 includes a source coupled with the drain of the PMOS transistor MP1, a drain coupled with the output terminal PD, and a gate coupled with the corresponding column selection line YID<0>. To increase the efficiency of sensing the logic low state of the corresponding column selection line YID<0>, the PMOS transistor MP2 may be designed to be a low-voltage transistor.

Also, the pull-up driver 320 includes a PMOS transistor MP3 which includes a source coupled with the clamp voltage terminal VDDYCLP, a drain coupled with the corresponding column selection line YID<0>, and a gate for receiving the pull-up control signal PUB.

Also, the pull-down driver 325 includes an NMOS transistor MN3 which includes a source coupled with the ground voltage terminal VSS, a drain coupled with the corresponding column selection line YID<0>, and a gate for receiving the pull-down control signal PD.

Also, the first disabler 330 includes a PMOS transistor MP4 which includes a source coupled with the clamp voltage terminal VDDYCLP, a drain coupled with the output terminal PUB of the pull-up sensor 310, and a gate for receiving the corresponding booster enable signal YIDSUMB<0>.

Also, the second disabler 335 includes an NMOS transistor MN4 which includes a source coupled with the ground voltage terminal VSS, a drain coupled with the output terminal PD of the pull-down sensor 315, and a gate for receiving the corresponding booster enable signal YIDSUMB<0>.

Figure 4:
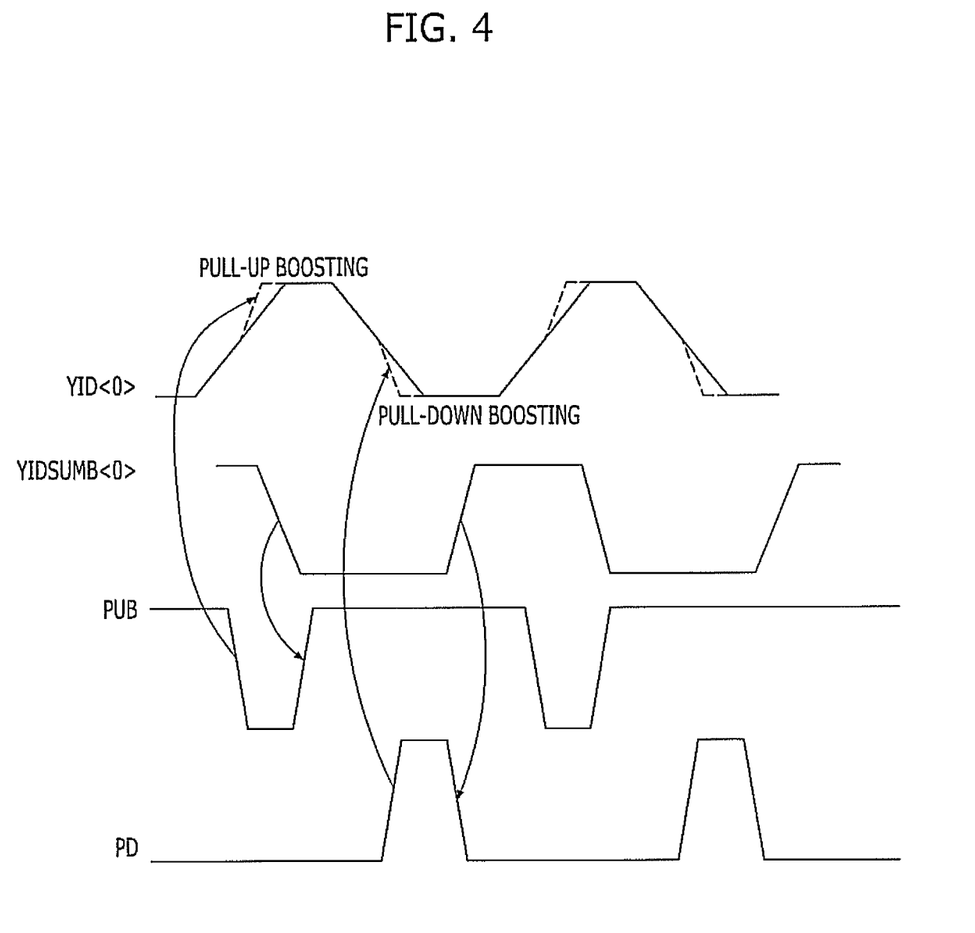
FIG. 4 is a timing diagram of the circuit illustrated in FIGS. 1 to 3.

FIG. 4 is a timing diagram of the circuit illustrated in FIGS. 1 to 3. The drawing shows a case where one column selection line YID<0> is selectively enabled among the multiple column selection lines YID<0:K>.

Since all of the column selection lines YID<0:K> are disabled to a logic low level before a column address is applied, the booster enable signal YIDSUMB<0> is kept in a logic high level.

Therefore, the NMOS transistor MN1 of the pull-up sensor 310 of the self-booster unit 120 is turned on, and the PMOS transistor MP1 of the pull-down sensor 315 is turned off.

Also, the PMOS transistor MP4 of the first disabler 330 is turned off, while the NMOS transistor MN4 of the second disabler 335 is turned on.

Meanwhile, since the column selection line YID<0> is disabled to a logic low level, the pull-up control signal PUB is disabled to a logic high level, and the pull-down control signal PD is disabled to a logic low level as well. In other words, the pull-up driver 320 and the pull-down driver 325 are disabled, and the column selection line YID<0> is not driven at all.

Subsequently, when a column address is applied and a column selection signal YI<0> is enabled, the column selection line driver 100 drives the column selection line YID<0> in a logic high level. The booster enable unit 110 enables the booster enable signal YIDSUMB<0> in a logic low level, when any one among the column selection signals YI<0:3> that are assigned to the booster enable unit 110 transitions to a logic high level.

Although the logic level of the column selection line YID<0> is pulled up while the column selection line driver 100 drives the column selection line YID<0> in a logic high level, there is a delay for a predetermined time until the booster enable signal YIDSUMB<0> transitions to a logic low level. This is because, as illustrated in FIG. 2A, several gates have to be gone through for the transition of the column selection line YID<0> to be reflected into the booster enable signal YIDSUMB<0> in the booster enable unit 110.

As described above, before the column selection line YID<0> transitions to a logic high level and the booster enable signal YIDSUMB<0> is enabled to a logic low level, the NMOS transistors MN0 and MN1 of the pull-up sensor 310 of the self-booster unit 120 are turned on and thus the pull-up control signal PUB is disabled to a logic high level. Herein, the pull-down control signal PD maintains to be in a logic low level. As shown above, the duration where the pull-up control signal PUB is enabled to a logic low level corresponds to the delay time that is needed to generate the booster enable signal YIDSUMB<0>. In the duration where the pull-up control signal PUB is disabled to a logic high level, the PMOS transistor MP3 of the pull-up driver 320 additionally pull-up boosts the column selection line YID<0>. Meanwhile, when the booster enable signal YID-SUMB<0> transitions to a logic low level, the PMOS transistor MP4 of the first disabler 330 is turned on, while the NMOS transistor MN4 of the second disabler 335 is turned off. Therefore, the pull-up control signal PUB is disabled back to the logic high level so as to terminate the pull-up boosting of the column selection line YID<0>.

Subsequently, when the column selection signal YI<0> is disabled, the column selection line driver 100 drives the column selection line YID<0> in a logic low level. Herein, the booster enable signal YIDSUMB<0> maintains the logic low level for a predetermined time from the moment when the column selection line YID<0> begins to be driven in a logic low level. Therefore, the PMOS transistors MP1 and MP2 of the pull-down sensor 315 are turned, and the pull-down control signal PD is enabled to a logic high level.

As the pull-down control signal PD transitions to a logic high level, the NMOS transistor MN3 of the pull-down driver 325 additionally pull-down boosts the column selection line YID<0>. Meanwhile, when the booster enable signal YID-SUMB<0> transitions to a logic high level, the PMOS transistor MP4 of the first disabler 330 is turned off, and the NMOS transistor MN4 of the second disabler 335 is turned on. Therefore, the pull-down control signal PD is disabled back to the logic low level so as to terminate the pull-down boosting of the column selection line YID<0>.

Herein, the self-booster unit 120 maintains to be in the disable state until the column selection line YID<0> is selected again.

Figure 5:
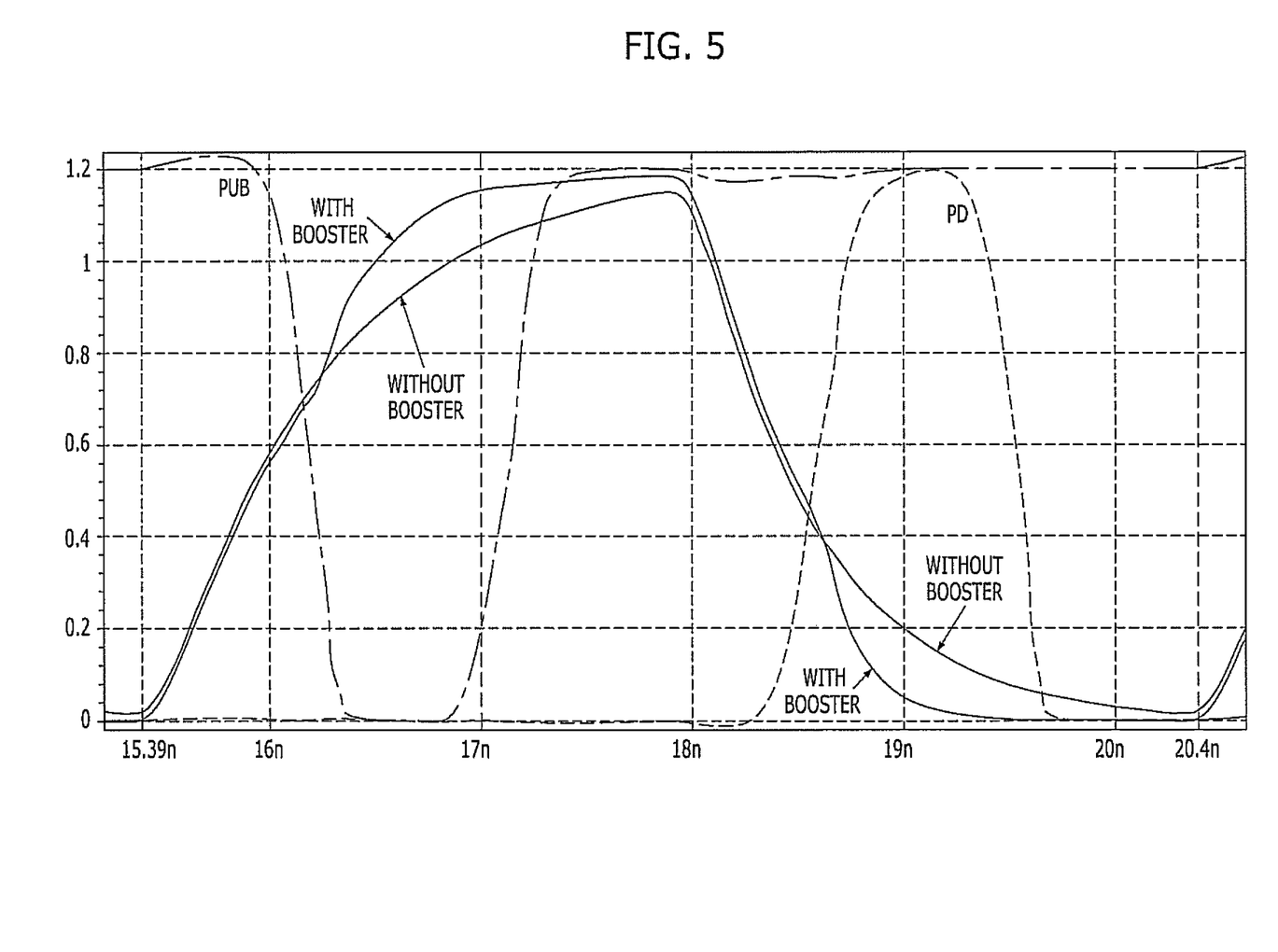
FIG. 5 is a graph showing a simulation result of the column selection line driving circuit when the self-booster unit 120 is used (with booster) in accordance with an embodiment of the present invention and a simulation result of the column selection line driving circuit when a booster is not used in accordance with the prior art (without booster).

FIG. 5 is a graph showing a simulation result of a column selection line driving circuit when the self-booster unit 120 is used (with booster) in accordance with an embodiment of the present invention and a simulation result of the column selection line driving circuit when a booster is not used in accordance with the prior art (without booster).

As illustrated in FIG. 5, when the self-booster unit 120 is used in accordance with the embodiment of the present invention, a sufficient driving force for a column selection line may be obtained and with the sufficient driving force, the operation speed of a semiconductor device may be improved.

As described above, the semiconductor device in accordance with an embodiment of the present invention does not generate a control signal to boost the column selection line driving circuit but boosts the a column selection line in the opposite side to a column selection line driver by sensing the logic level of the column selection line. Therefore, it is not difficult to control boost timing and the current consumption may be prevented from increasing. Also, since no repeater is used, the circuit area is not increased. As described earlier, a dummy cell array and a dummy sense amplifier array are needed to insert a repeater into a column selection line in a DRAM device having an open bit line structure. However, with the technology of the present invention, the area to be occupied by the dummy circuits is not required.

In accordance with another embodiment of the present invention, the self-boosting scheme is applied not to a column selection line driving circuit but to a word line driving circuit. Word lines are as long lines as the column selection lines and a driving force for word lines may be sufficiently obtained when a method of sensing the logic level of the word lines and boosting the word lines in the opposite part of a word line driver is used. The word line driving circuit includes a word line driver, a booster enable unit, and a booster. The word line driving circuit is not different from the column selection line driving circuit illustrated in FIG. 1, except that the lines to be driven is not the column selection lines but the word lines, which are sub-word lines, to be more specific.

Figure 6:
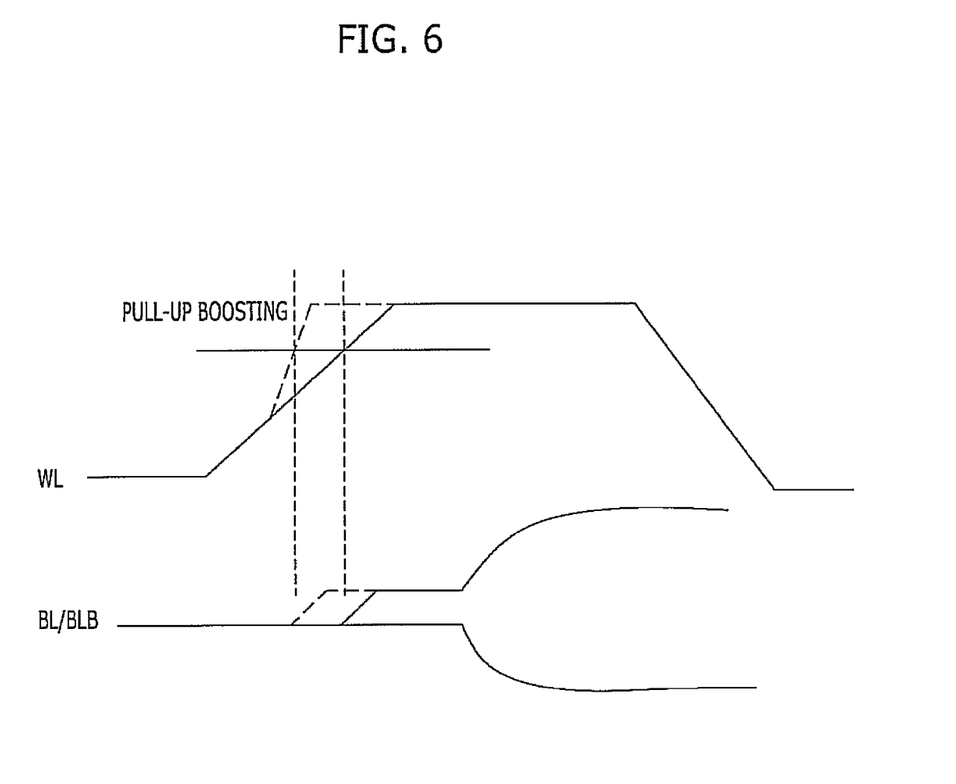
FIG. 6 is a timing diagram of a word line driving circuit in accordance with another embodiment of the present invention.

FIG. 6 is a timing diagram of a word line driving circuit in accordance with another embodiment of the present invention. The operation of the word line driving circuit is briefly described by referring to FIG. 6.

When an active command is applied and one word line WL is selected, the word line driver pull-up drives the word line WL. Meanwhile, a booster enable unit corresponding to the word line WL senses the increase in the level of the word line WL and thus enables a booster corresponding to the word line WL, and the booster pull-up boosts the word line WL.

Basically, when the word line WL is selected and the level of the word line WL is raised to a predetermined level, a cell transistor is turned on and a charge sharing occurs between a cell capacitor and a bit line pair BL/BLB. When the technology of the embodiment of the present invention is applied, the moment when the charge sharing occurs may be advanced due to the pull-up boosting by the booster. When the moment when the charge sharing occurs may be advanced, operation margin may be secured not only during an active operation but also during a read/write operation.

Herein, when the word line driving circuit initiates a precharge operation and performs a pull-down operation on the word lines, it does not have to perform a pull-down boosting due to relatively sufficient operation margin.

Also, when a word line is selected, the word line driver drives the selected word line with a high voltage VPP. Therefore, it is desirable to use a power source of a higher voltage level than the high voltage VPP as a pull-up boosting power source of the word line self-booster unit.

According to an embodiment of the present invention, sufficient driving force for a line with much load may be obtained while suppressing the increase in circuit area and current consumption, and the operation speed of a semiconductor device may be improved based on the sufficient driving force.

While the present invention has been described with respect to the specific embodiments, it will be apparent to those skilled in the art that various changes and modifications may be made without departing from the spirit and scope of the invention as defined in the following claims.

For example, the transistors and logics used in the above embodiments of the present invention may be substituted with other transistors and logics or omitted according to the kind and enable level of the used signal.

Also, although the above embodiments illustrate a case where the self-boosting scheme is applied to word lines, the technology of the present invention may be applied to other long lines as well.

Also, although the above embodiments illustrate a case where both pull-up boosting and pull-down boosting may be performed in the designing of the booster, the booster may be designed to perform either pull-up boosting or pull-down boosting in accordance with another embodiment of the present invention.

Also, the above embodiments illustrate a case where a clamp voltage VDDYCLP is used as a pull-up boosting power source. The clamp voltage VDDYCLP is a power source of a higher voltage level than an external power source voltage VDD supplied from the outside of a semiconductor device. However, it is not that only the clamp voltage VDDYCLP has to be used as a pull-up boosting power source.

Also, the above embodiments illustrate a case where the pulse widths of the pull-up control signal PUB and the pull-down control signal PD are decided based on the logic gate delay of a circuit that generates the booster enable signal YIDSUMB<0>. However, a delayer for delaying the booster enable signal YIDSUMB<0> by a predetermined time may be added to control the pulse widths, and the booster enable signal YIDSUMB<0> may be applied to the pull-up sensor 310, the pull-down sensor 315, the first disabler 330, and the second disabler 335.

What is claimed is:

1. A semiconductor device, comprising:
a plurality of target lines to be driven;
a plurality of target line drivers configured to drive the corresponding target lines in a logic level corresponding to a plurality of target line selection signals;
a plurality of booster enable units configured to generate booster enable signals by sensing whether a corresponding group of target lines is enabled or not; and
a plurality of self-boosters configured to boost the respective target lines by sensing levels of the respective target lines based on the booster enable signals.

2. The semiconductor device of claim 1, wherein each of the booster enable units is assigned to two, four, or eight target lines.

3. The semiconductor device of claim 1, wherein each of the booster enable units includes an OR or NOR logic for receiving signals loaded on the corresponding group of the target lines.

4. A semiconductor device, comprising:
a plurality of column selection lines;
a plurality of column selection line drivers configured to drive the corresponding column selection lines in a logic level corresponding to a plurality of column selection signals;
a plurality of booster enable units configured to generate booster enable signals by sensing whether a corresponding group of column selection lines is enabled or not; and
a plurality of self-boosters configured to boost the respective column selection lines by sensing levels of the respective column selection lines based on the booster enable signals.

5. The semiconductor device of claim 4, wherein each of the booster enable units is assigned to two, four, or eight column selection lines.

6. The semiconductor device of claim 4, wherein each of the booster enable units includes an OR or NOR logic for receiving signals loaded on the corresponding group of the column selection lines.

7. The semiconductor device of claim 6, wherein each of the booster enable units includes:
a first NOR gate having an input terminal that is coupled with a first column selection line and a second column selection line;
a second NOR gate having an input terminal that is coupled with a third column selection line and a fourth column selection line;
a NAND gate receiving output signals of the first NOR gate and the second NOR gate; and
an inverter receiving an output signal of the NAND gate and outputting a booster enable signal corresponding to the first to fourth column selection lines.

8. The semiconductor device of claim 4, wherein each of the self-boosters includes:
a pull-up sensor for enabling a pull-up control signal by sensing a pull-up state of a corresponding column selection line in response to a corresponding booster enable signal;
a pull-down sensor for enabling a pull-down control signal by sensing a pull-down state of a corresponding column selection line in response to the corresponding booster enable signal;
a first disabler for disabling the pull-up control signal in response to the corresponding booster enable signal;
a second disabler for disabling the pull-down control signal in response to the corresponding booster enable signal;
a pull-up driver for pull-up boosting a corresponding column selection line in response to the pull-up control signal; and
a pull-down driver for pull-down boosting the corresponding column selection line in response to the pull-down control signal.

9. The semiconductor device of claim 8, wherein the pull-up sensor includes:
a first PMOS transistor which includes a source coupled with a pull-up boosting voltage terminal, a drain coupled with a pull-up control signal output terminal, and a gate coupled with the corresponding column selection line;
a first NMOS transistor which includes a source coupled with a ground voltage terminal, and a gate for receiving the corresponding booster enable signal; and
a second NMOS transistor which includes a source coupled with a drain of the first NMOS transistor, a drain coupled with a pull-down control signal output terminal, and a gate coupled with the corresponding column selection line.

10. The semiconductor device of claim 8, wherein the pull-up sensor includes:
- a first NMOS transistor which includes a source coupled with a ground voltage terminal, a drain coupled with a pull-down control signal output terminal, and a gate coupled with the corresponding column selection line;
- a first PMOS transistor which includes a source coupled with a pull-up boosting voltage terminal, and a gate for receiving the corresponding booster enable signal; and
- a second PMOS transistor which includes a source coupled with the drain of the first PMOS transistor, a drain coupled with a pull-down control signal output terminal, and a gate coupled with the corresponding column selection line.

11. The semiconductor device of claim 9, wherein the first disabler includes:
- a second PMOS transistor which includes a source coupled with the pull-up boosting voltage terminal, a drain coupled with the pull-up control signal output terminal, and a gate for receiving the corresponding booster enable signal.

12. The semiconductor device of claim 10, wherein the second disabler includes:
- a second NMOS transistor which includes a source coupled with the ground voltage terminal, a drain coupled with the pull-down control signal output terminal, and a gate for receiving the corresponding booster enable signal.

13. The semiconductor device of claim 8, wherein the pull-up driver includes:
- a PMOS transistor which includes a source coupled with the pull-up boosting voltage terminal, a drain coupled with the corresponding column selection line, and a gate for receiving the pull-up control signal.

14. The semiconductor device of claim 8, wherein the pull-down driver includes:
- an NMOS transistor which includes a source coupled with the ground voltage terminal, a drain coupled with the corresponding column selection line, and a gate for receiving the pull-down control signal.

15. The semiconductor device of claim 8, wherein the pull-up sensor, the pull-down sensor, the first disabler, and the pull-up driver use a clamp voltage that is higher than an external power source voltage supplied from outside by a predetermined level as a pull-up boosting power source.

16. The semiconductor device of claim 8, further comprising:
- a delayer for delaying the corresponding booster enable signal by a predetermined time and applying the delayed booster enable signal to the pull-up sensor, the pull-down sensor, the first disabler, and the second disabler.

17. A semiconductor device, comprising:
- a plurality of word lines;
- a plurality of word line drivers configured to drive the corresponding word lines in a logic level corresponding to a plurality of word selection signals;
- a plurality of booster enable units configured to generate booster enable signals by sensing whether a corresponding group of word lines is enabled or not; and
- a plurality of self-boosters configured to pull-up boost the respective word lines by sensing levels of the respective word lines based on the booster enable signals.

18. The semiconductor device of claim 17, wherein each of the booster enable units is assigned to two, four, or eight word lines.

19. The semiconductor device of claim 17, wherein each of the booster enable units includes an OR or NOR logic for receiving signals loaded on the corresponding group of the word lines.

20. The semiconductor device of claim 17, wherein a power source having a voltage level higher than a pull-up power source of the word line drivers is used as a pull-up boosting power source of the self-boosters.

* * * * *